(12) United States Patent
Tseng et al.

(10) Patent No.: US 7,696,972 B2
(45) Date of Patent: Apr. 13, 2010

(54) SINGLE CLOCK DRIVEN SHIFT REGISTER AND DRIVING METHOD FOR SAME

(75) Inventors: Jung-Chun Tseng, Pingtung Hsien (TW); Sheng-Chao Liu, Kaohsiung (TW); Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 1346 days.

(21) Appl. No.: 11/144,939

(22) Filed: Jun. 6, 2005

(65) Prior Publication Data
US 2006/0017685 A1    Jan. 26, 2006

(30) Foreign Application Priority Data
Jul. 23, 2004    (TW) ............................... 93122111 A

(51) Int. Cl.
*G09G 3/36*    (2006.01)
(52) U.S. Cl. .................... 345/98; 345/208; 345/211; 377/64
(58) Field of Classification Search .............. 345/42, 345/52–54, 76–83, 98–100, 211–213; 377/64, 377/67, 69, 70, 73–75, 77–80; 340/784, 340/666
See application file for complete search history.

(56) References Cited

U.S. PATENT DOCUMENTS

| | | | | |
|---|---|---|---|---|
| 6,288,699 B1 * | 9/2001 | Kubota et al. | ............... | 345/99 |
| 6,580,423 B1 * | 6/2003 | Murade | ............... | 345/204 |
| 7,280,093 B1 * | 10/2007 | Hiroki | ............... | 345/100 |

* cited by examiner

*Primary Examiner*—Henry N Tran
(74) *Attorney, Agent, or Firm*—Thomas, Kayden, Horstemeyer & Risley

(57) ABSTRACT

A single clock driven shift register comprising multiple stages is provided. The (M)th stage comprises a latch unit, a logic unit, and a non-overlap buffer. The latch unit latches an input signal from the (M−1)th stage according to a clock signal. The logic unit connecting to an output terminal of the latch unit deals with an output signal of the latch unit and the clock signal with an NAND logic calculation. The non-overlap buffer connecting to the output terminal of the logic unit comprises at least three inverters connected in a serial, and an output signal of the first inverter coupled to the output terminal of the logic unit is input to an latch unit of the (M+1)th stage. Meanwhile, an output signal of the non-overlap buffer of the (M−1)th stage is input to the non-overlap buffer or the logic unit to delay the output signal of the non-overlap buffer.

17 Claims, 8 Drawing Sheets

__US 7,696,972 B2__

SINGLE CLOCK DRIVEN SHIFT REGISTER AND DRIVING METHOD FOR SAME

FIELD OF THE INVENTION

This invention relates generally to a single clock driven shift register utilized in a display driving circuit, more particularly, it relates to a single clock driven shift register capable of improving the output signal overlap of itself.

DESCRIPTION OF THE RELATED ART

Based on the requirements of lightness, thinness, and non-radiation, LCD replaces CRT gradually. It is utilized in electronic products, such as desk computer, PDA, notebook computer, digital camera and cellular telephone etc.

In order to display images, we perform electric field to control the transmittance of the liquid crystal in Active Matrix Liquid Crystal Display (AMLCD). As indicated in FIG. 1A, a typical AMLCD 10 comprises a LCD panel 20 and a driving system 30. The LCD panel 20 has a pixel array 22 on it. The driving system 30 comprises a controller 32, a source driver 34 and a scan driver 36. Each pixel unit 122 in the pixel array 22 connects with a thin film transistor (TFT) 124 electrically. And the source of the TFT 124 connects with the source driver 34 electrically; the gate of the TFT connects with the scan driver 36. So the TFT acts as a switch to control the working of the pixel unit 122. The controller 32 is used to transfer an input display signal (DS) to generate a display data (D), a horizontal clock signal (HCK) and a horizontal start signal (HST), and then output them to the source driver circuit 34. Meanwhile, the controller 32 also generates a vertical clock signal (VCK) and vertical start signal (VST) to output to the scan driver 36. As indicated in FIG. 1B, the source driver 34 comprises a shift register 342 and a plurality of sampling gates 344. Each of the sampling gates 344 corresponds to the pixel unit 122 of the same column in the pixel array 22. The signals HCK and HST are input the shift register 342 to generate the sampling signals (Sa), then the signal Sa is input each of the sampling gates 344 in order. The sampling gate 344 receiving the Sa then is switched on to make signal D go through the sampling gate 344, and into the pixel array 22.

As indicated in FIG. 2, a circuit diagram of a typical shift register 40, and also referring to FIG. 3, shows a timing diagram of the electric signals at different sites in typical shift register 40. The typical shift register 40 with multiple stages is a true single phase dynamic circuit (TSPC). The (M)th stage comprises a latch unit 42, a NAND logic unit 44 and a inverter 46. The latch unit 42 is controlled by a HCK. The output signal S(m−1) from the (M−1)th stage is input the latch unit 42. Note that the signal input the latch unit 42 of the first stage is the aforementioned HST.

The NAND logic unit 44 is connected with the output terminal of the latch unit 42 to apply the NAND logic operation to the output signal A from the latch unit 42 and the HCK. The inverter 46 is connected with the output terminal of the NAND logic unit 44 to change the polarity of the output signal B of the NAND logic unit 44. Meanwhile, referring to FIG. 1, the output signal S(m) of the inverter 46 is the sampling signal (Sa). The Sa is input to the sampling gate 344 to sample the display data D, and is also input to the latch unit 42 of the (M+1)th stage as the input signal of the (M+1)th stage.

As indicated in FIG. 4A, a timing diagram of the typical TSPC shift register having four stages is shown. In this diagram, the V(STX) corresponds to the horizontal start signal HST, the V(CLK) corresponds to the horizontal clock signal HCK and V(OUT_A1) to V(OUT_A4) corresponding to S(1) to S(4) respectively are the output signals of the first to forth stage.

As indicated in FIG. 4B, a simulated waveform diagram of two neighboring stages of the typical TSPC shift register is shown. In this diagram, the boundary area between V(OUT_A1) and V(OUT_A2), the simulated output signals of two neighboring stages, overlaps apparently. In other word, the sampling signal input to each sampling gate by the shift register is overlapping. The overlap affects the precision of the sampling and the image quality seriously.

The aforementioned description is aimed at the shift register 342 in source driver 34. However, another shift register is disposed in the scan driver 36, it generates scan signal and then inputs them to the pixel array 22 in order according to the vertical clock signal (VCK) and vertical start signal (VST). The shift register sited in scan driver 36 may also overlap between the output scan signals of two neighboring stages. The overlap affects the precision of the on/off time of every TFT 124.

The invention use a non-overlap technology to improve the overlap of the output signals of the traditional shift register, so as to make the data sampling and writing more precisely.

SUMMARY OF THE INVENTION

The object of this invention is to solve the problem that the overlap of the output signal from the traditional single clock shift register affects the image quality.

In order to realize aforesaid object, this invention provides a driving circuit of a flat panel display comprising a single clock driven shift register generates a sampling signal or a scan signal according to a clock signal and a start signal. The single clock driven shift register comprises multiple stages, wherein the (M)th stage comprises a latch unit, a logic unit and a non-overlap buffer. The latch unit latches the input signal of the (M−1)th stage according to a clock signal. The logic unit is connected with an output terminal of the latch unit to apply a logical operation to an output signal of the latch unit and the clock signal. The non-overlap buffer including at least three serially connected inverters is connected with the output terminal of the logic unit. The output signal of the (odd-number)th inverter coupled to the output terminal of the logic unit is input to the latch unit of the (M+1)th stage. Meanwhile, the output signal of the non-overlap buffer of the (M−1)th stage is input to the non-overlap buffer of the (M)th stage or the logic unit of the (M)th stage to delay the output signal of the non-overlap buffer.

Other features and advantages of the invention will become apparent from the following description, including the drawings and the claims.

BRIEF DESCRIPTION OF THE DRAWINGS

The related drawings in connection with the detailed description of this invention, which is to be made later, are described briefly as follows, in which.

DETAILED DESCRIPTIONS OF THE PREFERRED EMBODIMENTS

Figure 5:
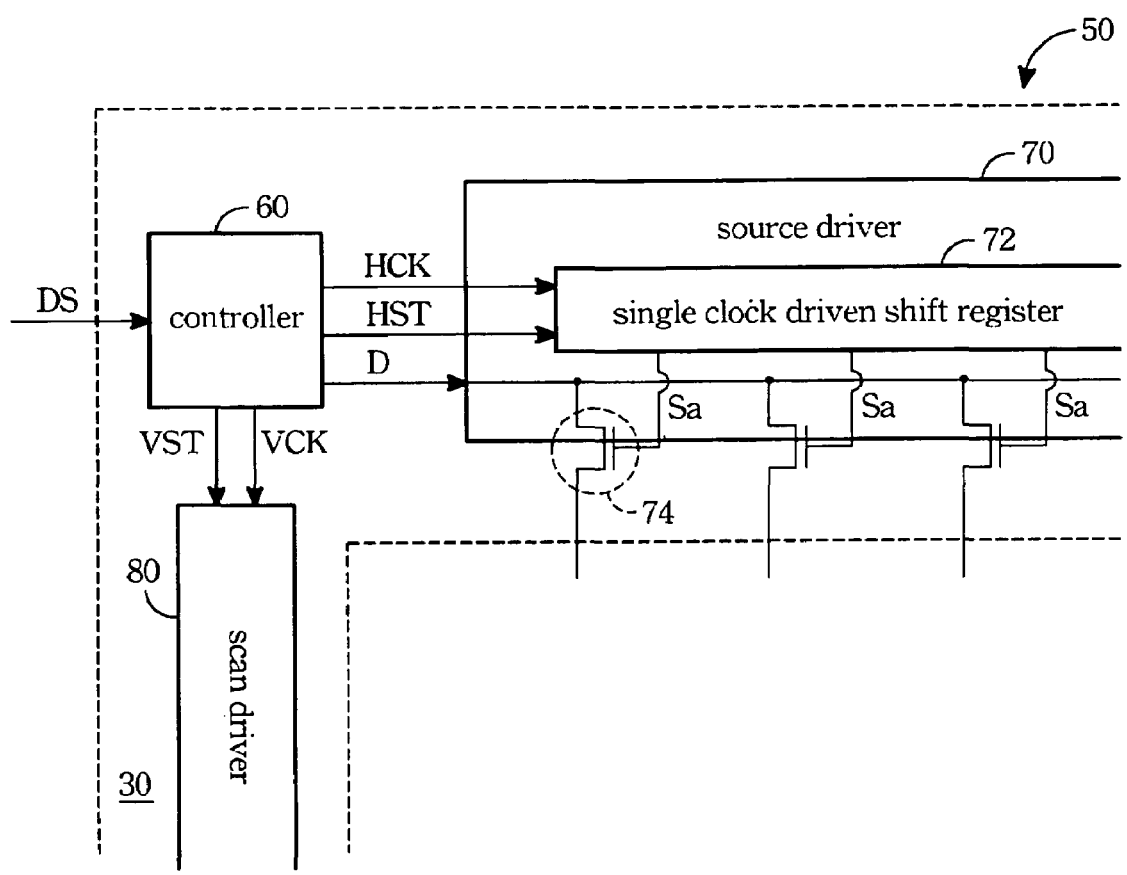
FIG. 5 is a block diagram of a preferred embodiment of a driving system according to this invention.

FIG. 5 is a block diagram of a preferred embodiment of a driving system according to this invention. As shown, the driving system 50 comprises a controller 60, a source driver 70 and a scan driver 80. The controller 60 generates a display data D, a horizontal clock signal HCK and a horizontal start signal HST to input to the source driver 70 and also generates a vertical clock signal VCK and a vertical start signal VST to input to the scan driver 80 at the same time. The source driver 70 comprises a single clock driven shift register 72 and a plurality of sampling gates 74, wherein each of sampling gates 74 corresponds to one column of the pixel array (not shown) on the display panel. The horizontal clock signal HCK and the horizontal start signal HST from the controller 60 are input to the single clock driven shift register 72 in order to generate the sampling signals Sa. The sampling signals Sa will be input to each of sampling gates 74 in order. The sampling gate 74 received the sampling signal Sa is switched on to make the display data D go through the sampling gate 74 and then input to the pixel array column by column.

Figure 6:
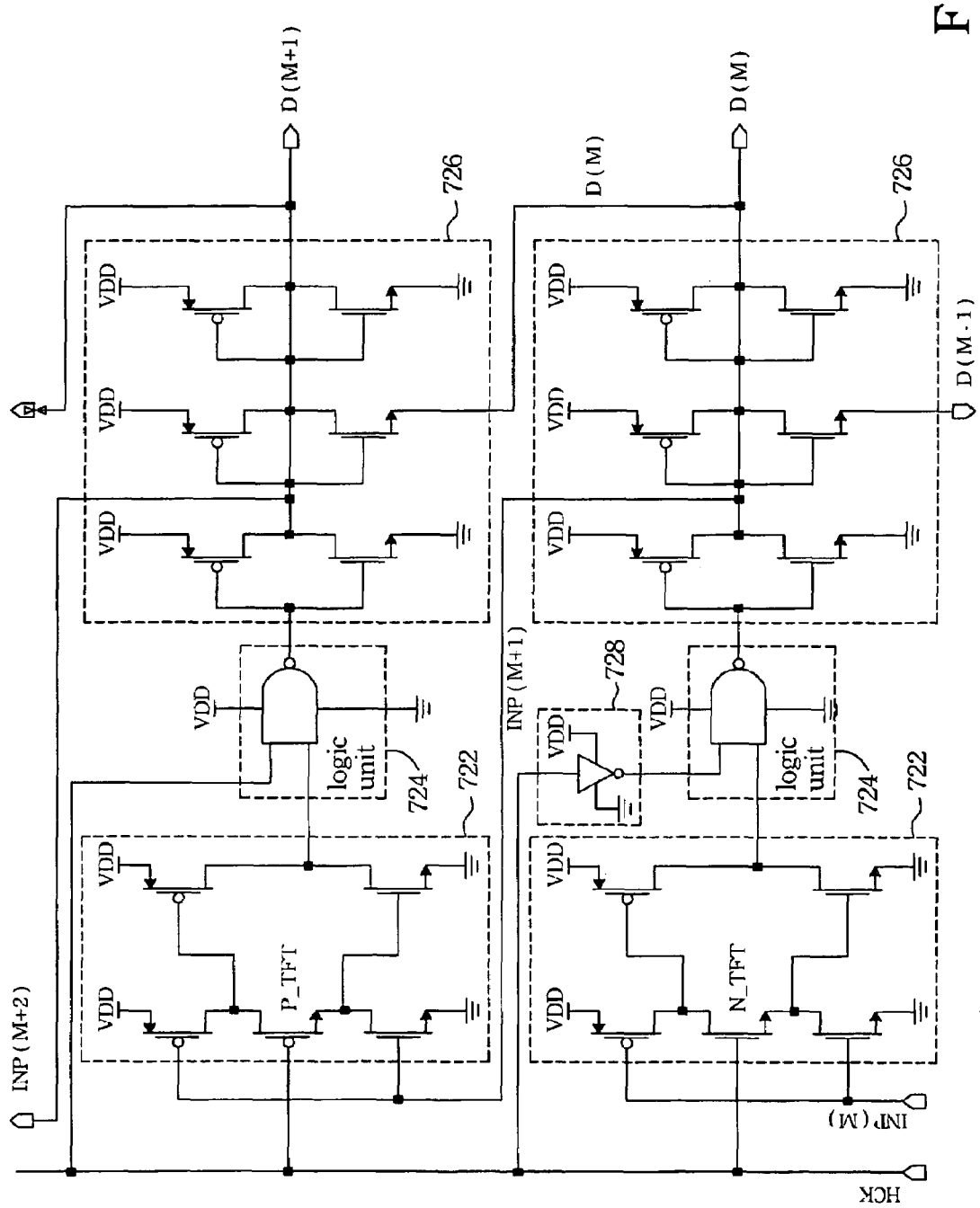
FIG. 6 is a circuit diagram of one preferred embodiment of a single clock driven shift register according to this invention.

FIG. 6 is a circuit diagram of one preferred embodiment of the single clock driven shift register 72 shown in FIG. 5. For simplification, the drawing only shows the (M)th and the (M+1)th stage of the single clock driven shift register 72. Every stage in the single clock driven shift register 72 has a latch unit 722, a logic unit 724 and a non-overlap buffer 726.

In the (M)th stage, the latch unit 722 is controlled by a horizontal clock signal HCK. the latch unit 722 latches the input signal INP(M) from the (M−1)th stage (the last stage) according to the horizontal clock signal HCK. The latching delays the voltage falling time of the input signal INP(M) to match the changing time of the horizontal clock signal HCK. Note that the input signal INP(L) of the first stage in the single clock driven shift register 72 is the horizontal start signal HST from the controller 60.

The logic unit 724 is connected with the output terminal of the latch unit 722 to apply an NAND operation to the output signal of the latch unit 722 and the horizontal clock signal HCK. Note that aforementioned logic unit 724 is not limited to be a single NAND logic unit. In order to generate the same result of said NAND operation, the logic unit 724 can also be constituted of different logic gates.

The non-overlap buffer 726 is connected with the output terminal of the logic unit 724, and includes three serially connected inverters. The output signal of the first inverter coupled to the output terminal of the logic unit 724 acts as an input signal INP(M+1) for the latch unit 722 in the (M+1)th stage (the next stage).

Subsequently, the output signal D(M) of the non-overlap buffer 726 is not only input into the sampling gate 74 as a sampling signal Sa, but also input into the non-overlap buffer 726 of the (M+1)th stage. In a preferred embodiment, the output signal D(M−1) from the (M−1)th stage is input to the second inverter coupled to the logic unit 724 in the (M)th stage, so as to delay the voltage rising time of output signal of the second inverter. Therefore, the voltage rising time of the output signal D(M) of the non-overlap buffer 726 is also delayed to buffer the overlap between the output signal D(M−1) and D(M).

As depicted in the forgoing description of the invention, the non-overlap buffer 726 includes not only three inverters but also more serially connected inverters according to different requirements. When the non-overlap buffer 726 includes more serially connected inverters, the output signal of the (odd-number)th inverter coupled to the output terminal of the logic unit 724 is input to the latch unit 722 of the (M+1)th stage as input signal INP(M+1). In addition, the output signal D(M−1) from the non-overlap buffer 726 of the (M−1)th stage is input to the (even-number)th inverter coupled to the output terminal of the logic unit 724 in the non-overlap buffer 726, so it can delay the voltage rising time of the output signal D(M).

Aforesaid output signal D(M) of the non-overlap buffer 726 is the sampling signal Sa described in FIG. 5. By means of operating the non-overlap buffer 726, the voltage rising time of the output signal D(M) is delayed to buffer the overlap of the sampling signal Sa, and to improve the sampling precision.

In order to match the positive-negative polarity changing of the horizontal clock signal HCK, a transistor controlled by the horizontal clock signal HCK in the latch unit 722 of the (M)th stage is a n-type transistor, and a transistor controlled by the horizontal clock signal HCK in the latch unit of the (M+1)th stage 722 is a p-type transistor. In other words, the polarity of said two transistors controlled by the horizontal clock signal HCK is opposite in the latch units 722 of two neighboring stages. Similarly, In order to match the positive-negative polarity changing of the horizontal clock signal HCK and make the logic unit 724 be operated normally, if the transistor controlled by the horizontal clock signal HCK is n-type, the horizontal clock signal HCK must be reversed by an inverter 728 before input the logic unit 724.

Figure 7:
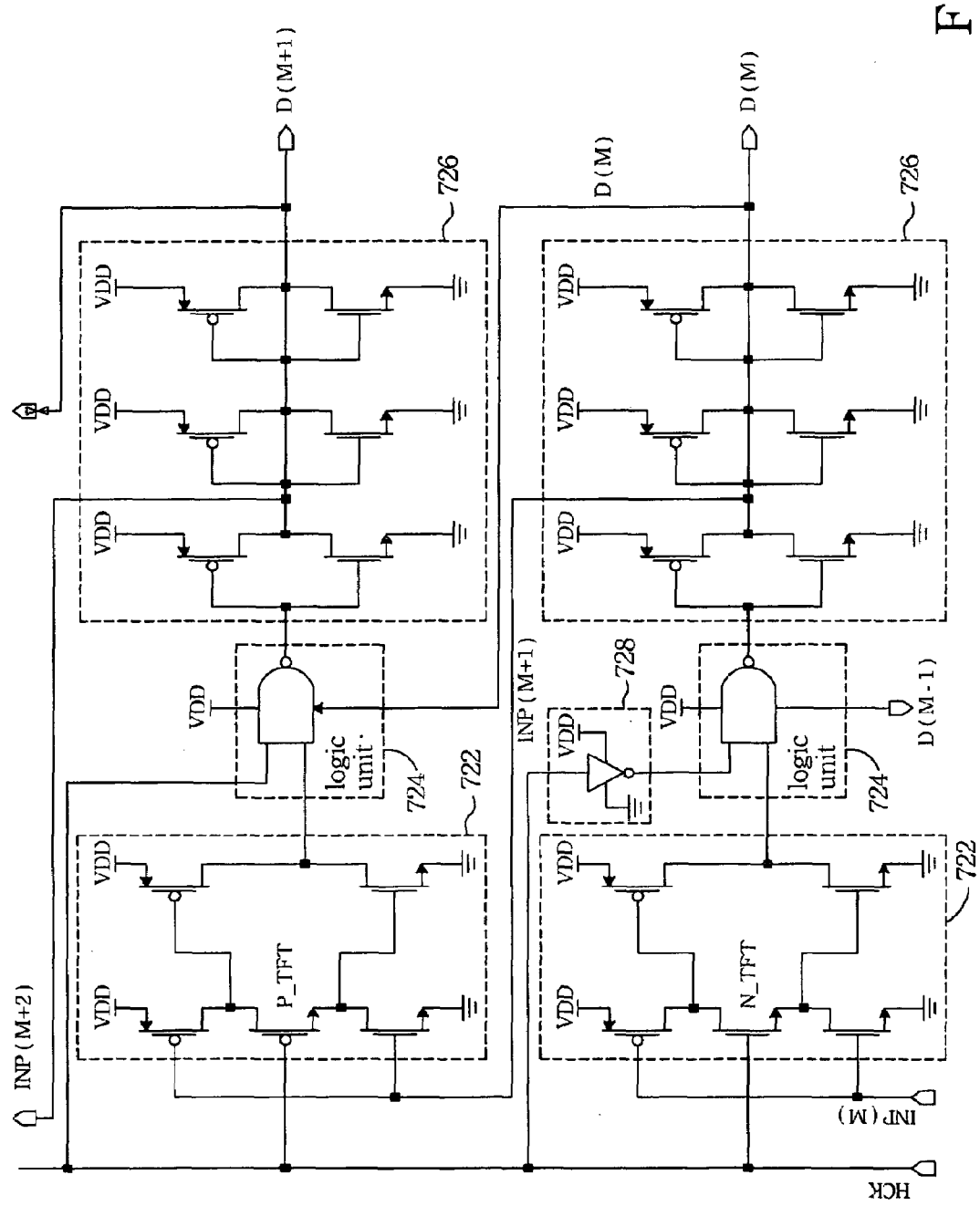
FIG. 7 is a circuit diagram of another preferred embodiment of a single clock driven shift register according to this invention.

FIG. 7 is a circuit diagram of another preferred embodiment of a single clock driven shift register according to this invention. For simplification, the drawing only shows the (M)th and the (M+1)th stage of the single clock driven shift register 72. Compared with the single clock driven shift register 72 shown in FIG. 6, the output signal D(M) of the non-overlap buffer 726 in this embodiment is input to the logic unit 724 of the (M+1)th stage. Similarly, the output signal D(M−1) from the non-overlap buffer of the (M−1)th stage is input to the logic unit 724 of the (M)th stage to delay the voltage rising time of the output signal of the logic unit 724. Furthermore, the voltage rising time of the output signal D(M) of the non-overlap buffer 726 is delayed to buffer the overlap between the output signal D(M−1) and D(M) and to improve the sampling precision.

Figure 8A:
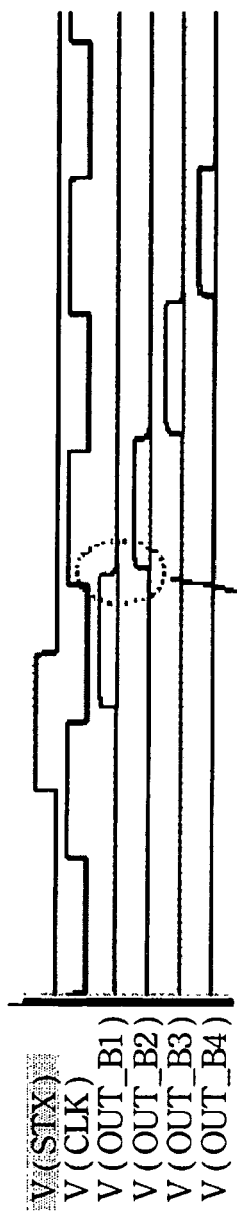
FIG. 8A is a timing diagram of a single clock driven shift register having four stages in this invention.

FIG. 8A is a timing diagram of a single clock driven shift register 72 shown in FIG. 6 which illustrates the simulating result when the shift register having four stages. In this diagram, the V(STX) corresponds to the horizontal start signal HST, the V(CLK) corresponds to the horizontal clock signal HCK and V(OUT_B1) to V(OUT_B4) corresponding to D(1) to D(4) respectively are the output signal of the first to forth stage.

Figure 1A:
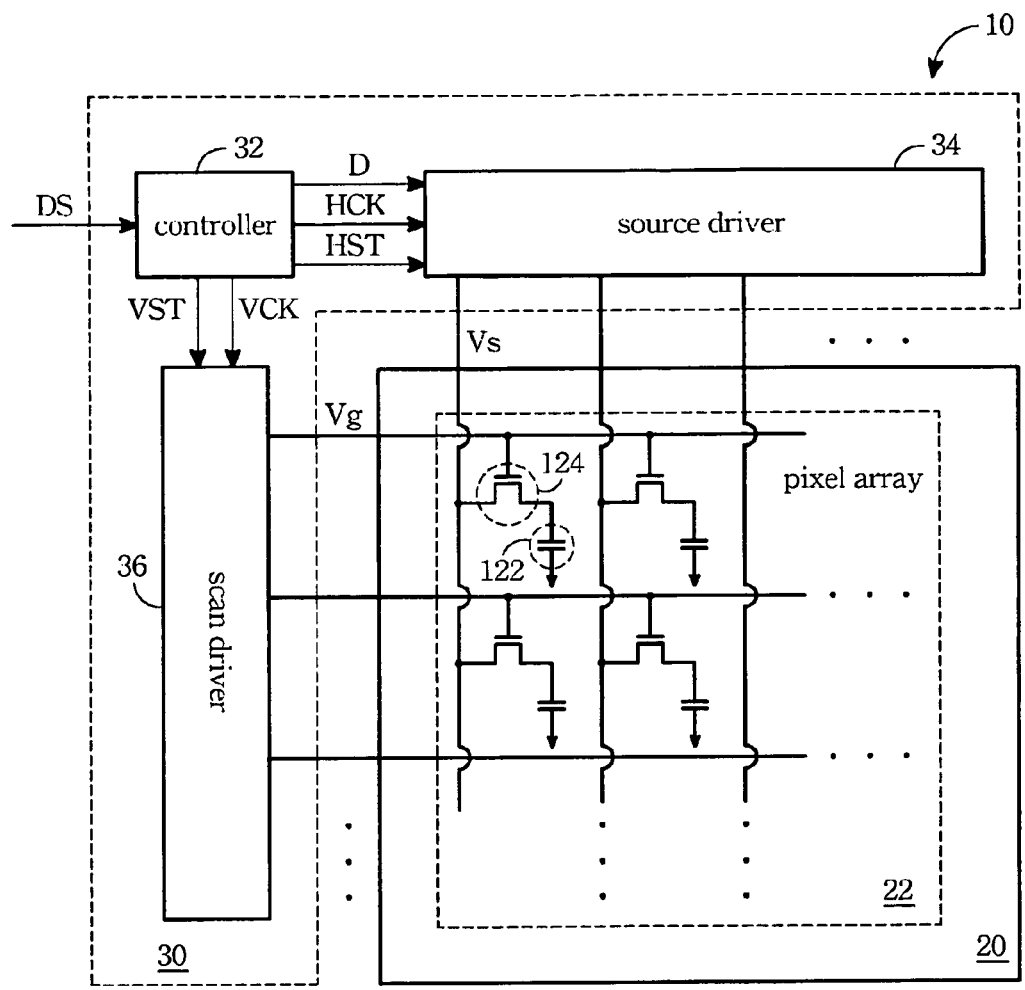
FIG. 1A is a block diagram of a typical active matrix liquid crystal display.
Figure 1B:
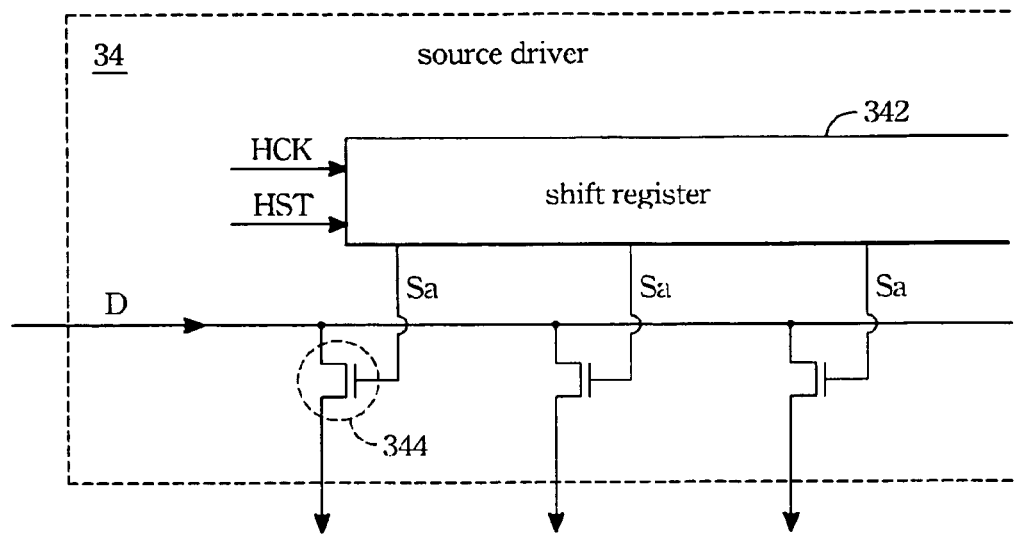
FIG. 1B is a block diagram of a source driver of the typical active matrix liquid crystal display.
Figure 2:
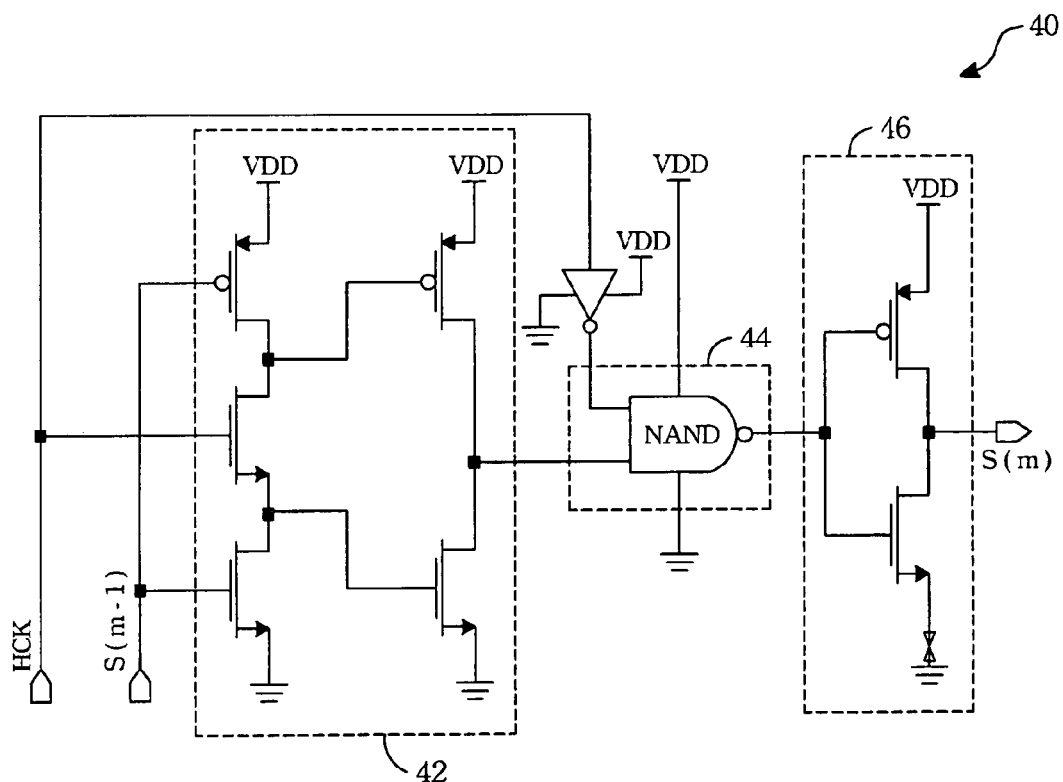
FIG. 2 is a circuit diagram of a typical shift register.
Figure 3:
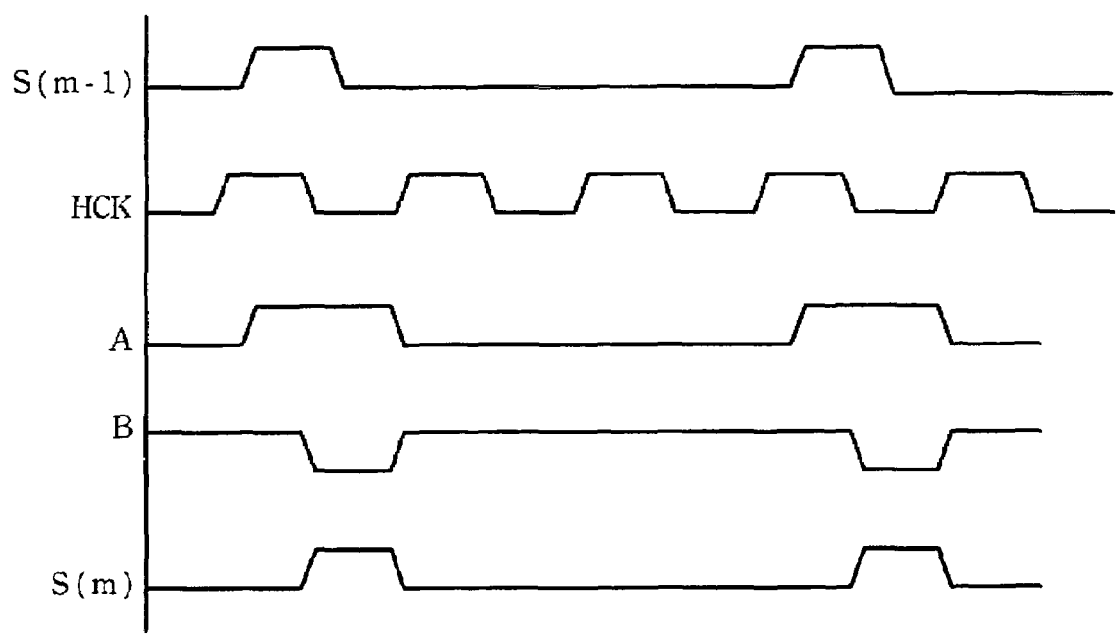
FIG. 3 is a timing diagram of the electric signals at different sites in typical shift register shown in FIG. 2.
Figure 4A:
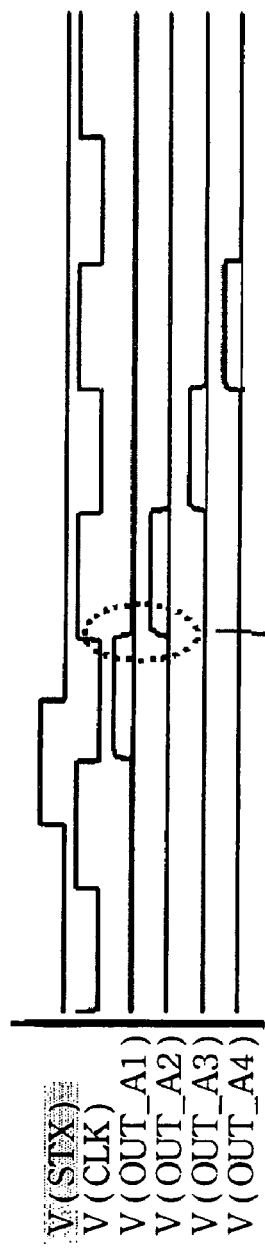
FIG. 4A is a timing diagram of a typical single clock driven shift register having four stages.
Figure 4B:
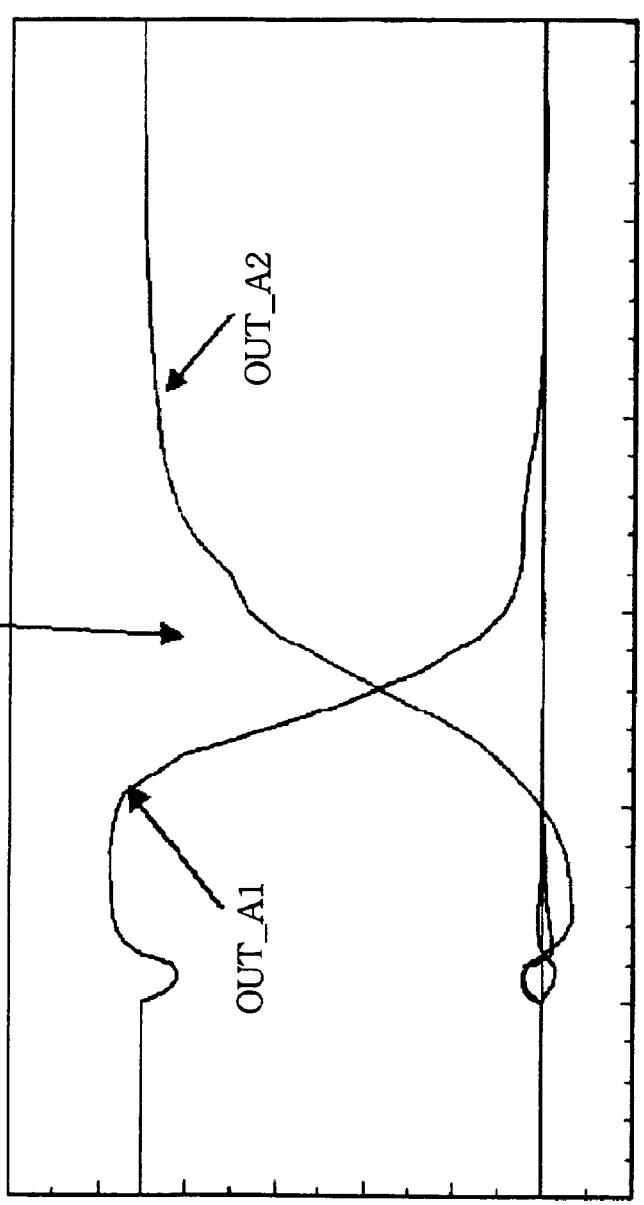
FIG. 4B is a simulated waveform diagram of two neighboring stages shown in FIG. 4A.
Figure 8B:
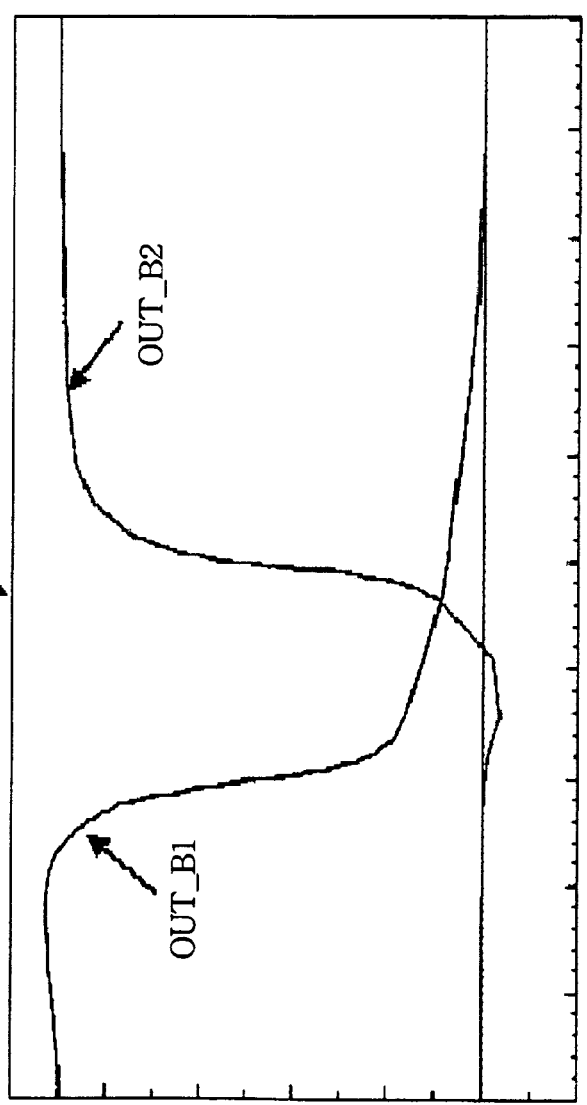
FIG. 8B is a simulated waveform diagram of two neighboring stages shown in FIG. 8A.

Referring to FIG. 8B, it is a simulated waveform diagram of the output signal OUT_B1 and OUT_B2 of two neighboring stages shown in FIG. 8A. Compared with the output result of the typical shift register shown in FIG. 4B, the single clock driven shift register of the present invention is capable of buffering the overlap between the output signals OUT_B1 and OUT_B2 of the two neighboring stages. Therefore, the shift register of the invention is capable of preventing the overlap of the sampling signals to improve the sampling precision and to ensure the quality of the image, simultaneously.

Aforementioned embodiments are aimed at the single clock driven shift register 72 in the source driver 70. However, another shift register in scan driver 80 (not shown) generates scan signals and then inputs them to pixel array 22 row after row according to the vertical clock signal (VCK) and vertical start signal (VST) generated from controller 60. The shift register of the invention can be utilize in the scan driver 80 to improve the overlap between the scan signals of two neighboring stages, so as to make the on/off time of every TFT in the pixel array accurate, moreover, to ensure the display data to write into the pixel array accurately.

In the above described, at least one preferred embodiment has been elucidated with reference to drawings annexed, it is apparent that numerous variations or modifications may be made without departing from the true spirit and scope thereof, as set forth in the claims below.

What is claimed is:

1. A single clock driven shift register, comprising: multiple stages electrically connected to each other, the (M)th stage comprising
    a latch unit for latching an input signal from the (M−1)th stage responsive to a clock signal;
    a logic unit, connected with an output terminal of the latch unit, for applying a logical operation to an output signal of the latch unit and the clock signal; and
    a non-overlap buffer including at least three serially connected inverters and being connected with the output terminal of the logic unit,
    whereby an output signal of the (odd-number)th inverter coupled to the output terminal of the logic unit is input to a latch unit of the (M+1)th stage, and an output signal of a non-overlap buffer of the (M−1)th stage is input to the non-overlap buffer to delay an output signal of the non-overlap buffer.

2. The single clock driven shift register according to claim 1, wherein the output signal of the first inverter coupled the output terminal of the logic unit is input to the latch unit of the (M+1)th stage.

3. The single clock driven shift register according to claim 1, wherein the non-overlap buffer comprises an odd number of serially connected inverters.

4. The single clock driven shift register according to claim 1, wherein the output signal of the non-overlap buffer of the (M−1)th stage is input to the (even-number)th inverter of the non-overlap buffer coupled to the output terminal of the logic unit.

5. The single clock driven shift register according to claim 1, wherein the latch unit of the (M)th stage includes a first transistor controlled by the clock signal, the latch unit of the (M+1)th stage includes a second transistor controlled by the clock signal, and the first transistor and the second transistor are n-type and p-type transistors arranged alternately.

6. The single clock driven shift register according to claim 1, wherein the latch unit of the (M)th stage includes a first transistor controlled by the clock signal, the first transistor is n-type, and the clock signal is input the logic unit though an inverter.

7. The single clock driven shift register according to claim 1, wherein the logic unit is a NAND logic unit.

8. A single clock driven shift register, comprising: multiple stages electrically connected to each other, the (M)th stage comprising
    a latch unit for latching an input signal from the (M−1)th stage responsive to a clock signal;
    a logic unit connected with an output terminal of the latch unit for applying a logical operation to an output signal of the latch unit and the clock signal; and a non-overlap buffer including at least three serially connected inverters and being connected with the output terminal of the logic unit,
    whereby an output signal of the (odd-number)th inverter coupled to the output terminal of the logic unit is input to a latch unit of the (M+1)th stage, and an output signal of a non-overlap buffer of the (M−1)th stage is input to the logic unit to delay an output signal of the non-overlap buffer.

9. The single clock driven shift register according to claim 8, wherein the output signal of the first inverter coupled the output terminal of the logic unit is input to the latch unit of the (M+1)th stage.

10. The single clock driven shift register according to claim 8, wherein the non-overlap buffer comprises an odd number of serially connected inverters.

11. The single clock driven shift register according to claim 8, wherein the latch unit of the (M)th stage includes a first transistor controlled by the clock signal, the latch unit of the (M+1)th stage includes a second transistor controlled by the clock signal, and the first transistor and the second transistor are n-type and p-type transistors arranged alternately.

12. The single clock driven shift register according to claim 8, wherein the latch unit of the (M)th stage includes a first transistor controlled by the clock signal, the first transistor is n-type, and the clock signal is input the logic unit though an inverter.

13. A driving method for a single clock driven shift register, wherein the single clock driven shift register comprises multiple stages electrically connected to each other, and the (M)th stage comprises a latch unit, a logic unit connected to the latch unit, and a non-overlap buffer connected to the logic unit, the driving method comprising the steps of:
    latching an input signal, generated by the (M−1)th stage, responsive to a clock signal;
    applying a logical operation to an output signal of the latch unit and the clock signal; and
    inputting an output signal, generated by the non-overlap buffer of the (M−1)th stage, to the logic unit of the (M)th stage, so as to delay the voltage rising time of the output signal of the non-overlap buffer of the (M)th stage to buffer the overlap between the output signals of the non-overlap buffer of the (M−1)th stage and the non-overlap buffer of the (M)th stage.

14. The driving method according to claim 13, wherein the step of inputting the output signal comprising inputting the output signal of the non-overlap buffer of the (M−1)th stage to the (even-number)th inverter of the non-overlap buffer coupled to the logic unit.

15. The driving method according to claim 13, wherein the step of latching the input signal comprising latching the output signal of the first inverter of the non-overlap buffer coupled to the logic unit.

16. The driving method according to claim 13, wherein the logical operation is a NAND operation.

17. A driving method for a single clock driven shift register, wherein the single clock driven shift register comprises multiple stages electrically connected to each other, and the (M)th stage comprises a latch unit, a logic unit connected to the latch unit, and a non-overlap buffer connected to the logic unit, the driving method comprising the steps of:

latching an input signal, generated by the (M−1)th stage, responsive to a clock signal;

applying a logical operation to an output signal of the latch unit and the clock signal; and inputting an output signal, generated by the non-overlap buffer of the (M−1)th stage, to the non-overlap buffer unit of the (M)th stage, so as to delay the voltage rising time of the output signal of the non-overlap buffer of the (M)th stage to buffer the overlap between the output signals of the non-overlap buffer of the (M−1)th stage and the non-overlap buffer of the (M)th stage.

* * * * *